United States Patent
Schaeffer et al.

(10) Patent No.: US 8,309,419 B2
(45) Date of Patent: Nov. 13, 2012

(54) CMOS INTEGRATION WITH METAL GATE AND DOPED HIGH-K OXIDES

(75) Inventors: James K. Schaeffer, Austin, TX (US); Eric D. Luckowski, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 798 days.

(21) Appl. No.: 12/365,317

(22) Filed: Feb. 4, 2009

(65) Prior Publication Data
US 2010/0197128 A1 Aug. 5, 2010

(51) Int. Cl.
*H01L 21/8238* (2006.01)

(52) U.S. Cl. ......................... 438/287; 438/199

(58) Field of Classification Search ................ None
See application file for complete search history.

(56) References Cited

U.S. PATENT DOCUMENTS

| | | | |
|---|---|---|---|
| 6,054,357 A * | 4/2000 | Choi | 438/306 |
| 6,897,095 B1 | 5/2005 | Adetutu et al. | |
| 2006/0246716 A1 * | 11/2006 | Colombo et al. | 438/637 |
| 2009/0152650 A1 * | 6/2009 | Chudzik et al. | 257/410 |
| 2009/0227078 A1 * | 9/2009 | Chen et al. | 438/199 |

OTHER PUBLICATIONS

T. Schram et al., Novel Process to Pattern Selectively Dual Dielectric Capping Layers Using Soft-Mask Only, 2008 Symposium on VLSI Technology Digest of Technical Papers, Jun. 17-19, 2008.

* cited by examiner

*Primary Examiner* — Zandra Smith
*Assistant Examiner* — Pamela E Perkins
(74) *Attorney, Agent, or Firm* — Hamilton & Terrile, LLP; Michael Rocco Cannatti

(57) ABSTRACT

A method and apparatus are described for fabricating single metal gate electrodes (35, 36) over a high-k gate dielectric layer (31, 32) that is separately doped in the PMOS and NMOS device areas (96, 97) by forming first capping oxide layer (23) with a first dopant species on a high-k gate dielectric layer (22) in at least the NMOS device area and also forming second capping oxide layer (27) with a second dopant species on a high-k gate dielectric layer (22) in at least the PMOS device area, where the first and second dopant species are diffused into the gate dielectric layer (22) to form a first fixed charge layer (31) in the PMOS device area of the high-k gate dielectric area and a second fixed charge layer (32) in the NMOS device area of the high-k gate dielectric area.

22 Claims, 4 Drawing Sheets

CMOS INTEGRATION WITH METAL GATE AND DOPED HIGH-K OXIDES

BACKGROUND OF THE INVENTION

1. Field of the Invention

The present invention is directed in general to the field of semiconductor devices. In one aspect, the present invention relates to the fabrication of metal gate electrodes used in semiconductor devices.

2. Description of the Related Art

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology is increasingly replacing silicon dioxide gate dielectrics and polysilicon gate conductors with high dielectric constant (high-k) dielectrics in combination with metal gate electrodes formed from a gate stack of polysilicon and one or more metal layers. With such technologies, the metal gate layers not only obviate gate-depletion and boron-penetration effects, but also provide a significantly lower sheet resistance.

While high-k dielectrics in conjunction with metal gate electrodes advantageously exhibit improved transistor performance, the use of new metal layer technologies can create new technical challenges. For example, to optimize drain current and device performance and reduce the voltage threshold Vts, the desired effective work function for NMOS and PMOS gate electrodes must be near the conduction (valence) band edge of silicon, meaning that the metals used in NMOS transistors should have effective work functions near 4.1 eV and metals used in PMOS transistors should have effective work functions near 5.2 eV. Since it is difficult to find a material that can have its work function adjusted once it is deposited, conventional approaches for obtaining differentiated work functions have involved forming separate gate electrode layers, such as by removing a deposited first metal gate layer from the gate insulator to deposit a second metal gate layer having a different work function. Such processes can damage the gate insulator layer, leading to high leakage or reliability problems for the finally formed device. Other approaches for modulating the work function for NMOS and PMOS gate electrodes toward the silicon conduction band edge have deposited capping layers of $La_2O_3$ (nFET) and $Al_2O_3$ (pFET) on the high-k gate dielectric (e.g., $HfO_2$), and then applying a high temperature process step to shift the threshold voltage to incorporate the La and Al into the high-k gate dielectric in the NMOS and PMOS areas, respectively. With CMOS fabrication flows, each oxide capping layer is patterned with resist and then removed with a wet etch that is selective to the high-k gate dielectric, but this integration scheme creates a number of processing problems, including resist undercut, resist lifting, resist removal without damaging the gate dielectric, and resist rework that shifts the voltage threshold.

Another method of incorporating the La and Al into the gate dielectric is to first deposit a thin capping layer of $Al_2O_3$ and a metal gate on top of a high-k gate dielectric, pattern the metal gate and then remove the metal and $Al_2O_3$ layers from the NMOS regions, and then deposit a thin NMOS capping layer of $La_2O_3$ and an NMOS metal gate layer. The order of this integration can be reversed such that the $La_2O_3$ and NMOS metals are deposited first. This scheme results in two gate stacks of unbalanced height which can be a major challenge for the subsequent gate etch process where, for example, the NMOS gate stack includes an $La_2O_3$/NMOS Metal layer stack, and the PMOS gate stack includes an $Al_2O_3$/PMOS Metal/$La_2O_3$/NMOS Metal layer stack.

Accordingly, a need exists for an improved metal gate electrode and manufacture method for incorporated very thin high-k gate dielectric materials in NMOS and PMOS devices having the work functions that are set near the silicon band edges for low voltage thresholds and improved device performance to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

DETAILED DESCRIPTION

Figure 1:
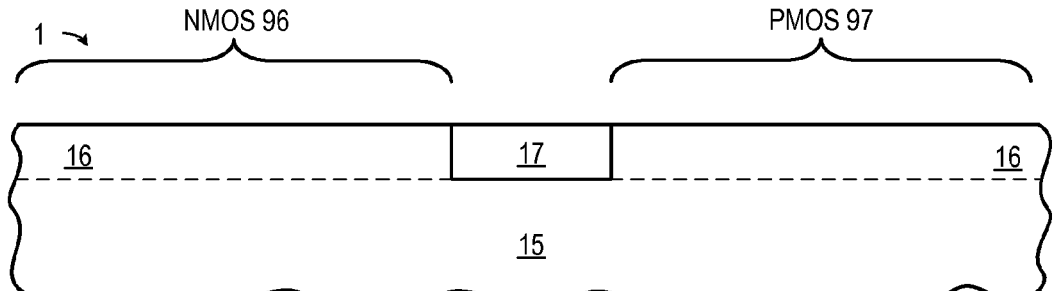
FIG. 1 is a partial cross-sectional view of a semiconductor wafer structure including a semiconductor layer having a first crystalline structure.

A method and apparatus are described for fabricating NMOS and PMOS transistors where each transistor includes a metal gate and a high-k gate dielectric that is doped with a species to shift the voltage threshold appropriately for the NMOS or PMOS device type. By forming separate NMOS and PMOS oxide capping layers on the high-k gate dielectric layer (e.g., hafnium dioxide) using a single patterned resist layer that is separated from the high-k gate dielectric layer by at least a first metal-based layer, the disclosed CMOS fabrication process provides separately doped gate dielectric layer while avoiding the problems created by putting resist in direct contact with the high-k gate dielectric layer. In addition, the disclosed integration scheme allows for resist rework, and results in the formation of a metal gate and high-k gate dielectric gate electrodes having substantially equal gate stack heights for the NMOS and PMOS devices. In an example process flow, a semiconductor wafer structure is provided having a high-k gate dielectric layer (e.g., $HfO_2$) formed on a substrate layer. After depositing a thin (e.g., 2-4 Angstroms) of a first capping oxide layer (e.g., $La_2O_3$), a first metal-based layer (e.g., TiN) is formed over the wafer structure, alone or in combination with a capping layer of amorphous silicon. The NMOS device area is then masked with a patterned resist layer, and the high-k gate dielectric layer in the PMOS device area is cleared by selectively removing the unmasked layers while leaving the first metal-based layer over the NMOS device area. A thin (e.g., 2-8 Angstroms) of a second capping oxide layer (e.g., $Al_2O_3$) is then deposited over the wafer structure, followed by the formation of second metal-based layer (e.g., TiN) and (another) capping layer of amorphous silicon. A thermal anneal process drives dopants from the first and second capping oxide layers into the high-k gate dielectric layer, after which the stack is deprocessed to remove capping silicon layer and second metal-based layer, thereby exposing the high-k gate dielectric layer having different doping in the PMOS and NMOS areas. In this process, the first and second capping oxide layers are not removed because they have already been driven into the high-k gate dielectric layer during the thermal anneal process. Finally, a single metal layer (e.g., TiN) and polysilicon layer are sequentially formed or deposited over the NMOS and PMOS device areas, and then selectively etched to form PMOS and NMOS gate electrodes having high-k gate dielectric layers that are separately doped to tune the threshold voltages. The disclosed fabrication sequence for separately doping the high-k gate dielectric layers can be used to make single metal gate layer devices, but can also be used to make dual metal gate layer devices.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, it is noted that, throughout this detailed description, certain layers of materials will be deposited and removed to form the depicted semiconductor structures. Where the specific procedures for depositing or removing such layers are not detailed below, conventional techniques to one skilled in the art for depositing, removing or otherwise forming such layers at appropriate thicknesses shall be intended. Such details are well known and not considered necessary to teach one skilled in the art of how to make or use the present invention. In addition, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain elements in the figures are illustrated for simplicity and clarity and have not necessarily been drawn to scale. For example, the dimensions of some of the elements in the figures may be exaggerated relative to other elements to help improve the understanding of the embodiments of the present invention.

Referring now to FIG. 1, there is shown a partial cross-sectional view of a semiconductor wafer structure 1. The structure 1 includes a semiconductor layer 16 formed on or as part of a semiconductor substrate 15 that has a first crystallographic orientation. Also illustrated is a shallow trench isolation 17 that divides the layer 16 into separate regions. Depending on the type of transistor device being fabricated, the semiconductor layer 15, 16 may be implemented as a bulk silicon substrate, single crystalline silicon (doped or undoped), semiconductor on insulator (SOI) substrate, or any semiconductor material including, for example, Si, SiC, SiGe, SiGeC, Ge, GaAs, InAs, InP, as well as other III/V or II/VI compound semiconductors or any combination thereof, and may optionally be formed as the bulk handling wafer. The semiconductor layer 15, 16 has a channel crystallographic orientation of <100>. Although not shown, the materials of layer 16 for NMOS and PMOS device areas 96, 97 may be different. And for any FET type (NMOS or PMOS), the layer 16 may consist of multiple stacks of materials. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor.

The isolation regions or structures 17 are formed to electrically isolate the NMOS device area(s) 96 from the PMOS device area(s) 97. Isolation structures 17 define lateral boundaries of an active region or transistor region 96, 97 in active layer 16, and may be formed using any desired technique, such as selectively etching an opening in the second semiconductor layer 16 using a patterned mask or photoresist layer (not shown), depositing a dielectric layer (e.g., oxide) to fill the opening, and then polishing the deposited dielectric layer until planarized with the remaining second semiconductor layer 16. Any remaining unetched portions of the patterned mask or photoresist layer(s) are stripped.

Figure 2:
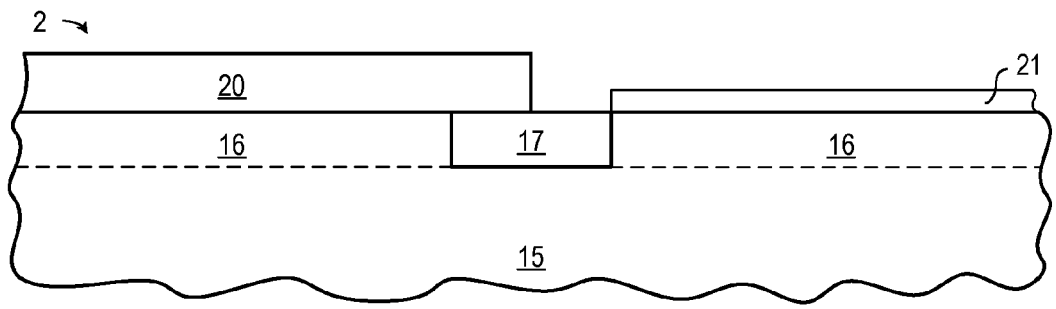
FIG. 2 illustrates processing subsequent to FIG. 1 where a masking layer is formed over NMOS areas of the semiconductor wafer structure and an epitaxial SiGe layer is selectively formed over PMOS areas of the semiconductor wafer structure.

FIG. 2 illustrates processing of a semiconductor wafer structure 2 subsequent to FIG. 1 where a patterned masking layer 20 is selectively formed over NMOS areas 96 of the semiconductor wafer structure and an epitaxial SiGe layer 21 is selectively formed over PMOS areas 97 of the semiconductor wafer structure. For example, one or more masking layers 20 (e.g., an oxide layer and/or nitride layer) may be deposited and/or grown over the semiconductor wafer structure, and then conventional patterning and etching techniques may be used to form an opening in the mask layer(s) 20 that exposes at least the PMOS device area 97. The selectively formed masking layer 20 is used to define and differentiate active regions for NMOS and PMOS devices subsequently formed on the wafer structure 16. After forming the patterned masking layer 20, a thin, compressively stressed semiconductor layer 21 is selectively formed over the PMOS area(s) 97 of the semiconductor wafer structure that will be used to form PMOS devices. In selected embodiments, the thin, compressively stressed semiconductor layer 21 is formed with a semiconductor material having larger atom-to-atom spacing than the underlying second semiconductor layer 16, such as SiGe, SiGeC, or combinations and composition by weight thereof, which is capable of being formed utilizing a selective epitaxial growth method or other deposition methods accompanied by subsequent re-crystallization. For example, if PMOS devices are formed over the semiconductor layer 16 in the PMOS area 97 and the semiconductor material for layer 16 is silicon, the semiconductor layer 21 may be formed by epitaxially growing a SiGe layer that is thinner than a critical relaxation thickness to form a compressive SiGe layer 21 having a lattice spacing the same as the semiconductor layer 16. This epitaxial growth may be achieved by a process of chemical vapor deposition (CVD) at a chamber temperature between 400 and 900° C. in the presence of silane, disilane, or dichlorosilane, and germane ($GeH_4$), HCl, and hydrogen gas. So long as the thickness of the SiGe layer 21 is below the critical relaxation thickness, the SiGe layer 21 is compressively stressed. As will be appreciated, the critical relaxation thickness for a SiGe layer will depend on the amount of germanium contained in the layer 21, though in an example embodiment, an epitaxially grown SiGe layer 21 that is approximately 50 Angstroms or less will have a uniform compressive stress. Because the lattice spacing of the silicon germanium is normally larger than the lattice spacing of the underlying silicon semiconductor layer 16, one advantage of forming the semiconductor layer 21 with compressive silicon germanium is that there is no stress induced on the silicon semiconductor layer 16. Another advantage of forming a relatively thin semiconductor layer 21 is to minimize the step height difference between the finally formed NMOS and PMOS device areas 96, 97, thereby improving processing uniformity between the two areas. While not shown, the silicon germanium layer 21 may be provided with a uniform grading or concentration of germanium as a function of depth, and there may also be a silicon cap layer formed or epitaxially grown over the silicon germanium layer 21 in the PMOS area(s) 97 of the semiconductor wafer structure which increases the threshold voltage and the subthreshold slope while improving hole mobility as compared to an un-capped SiGe channel region by providing a silicon/dielectric interface that has lower channel defectivity or interface trap density (Dit). In addition, it will be appreciated that the silicon germanium layer 21 can be omitted in selected embodiments, and in other embodiments, an additional layer of material (e.g., silicon carbide) can be formed over the NMOS areas 96 of the semiconductor wafer structure.

Figure 3:
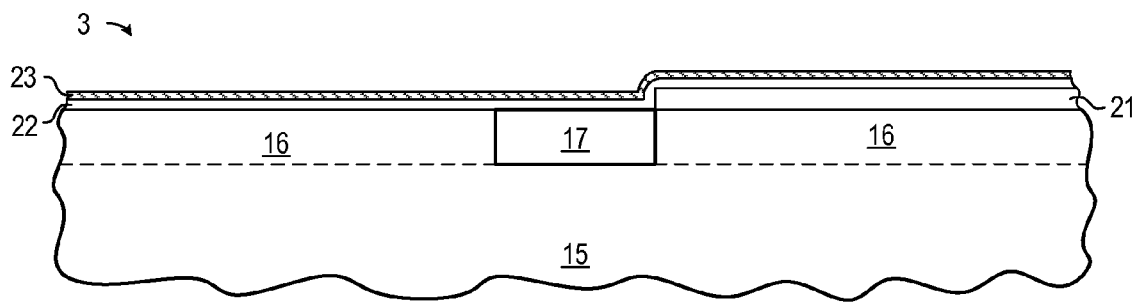
FIG. 3 illustrates processing subsequent to FIG. 2 after a high-k gate dielectric layer and first capping oxide layer are sequentially disposed over the semiconductor wafer structure.

FIG. 3 illustrates processing of a semiconductor wafer structure 3 subsequent to FIG. 2 after the mask layer 20 is removed, and a gate dielectric layer 22 and first capping oxide layer 23 are sequentially disposed over the NMOS and PMOS areas 96, 97. In selected embodiments, the gate dielectric layer 22 is formed by depositing or growing an insulator or high-k dielectric (e.g., silicon dioxide, oxynitride, metal-oxide, nitride, etc.) over the semiconductor substrate 3 using chemical vapor deposition (CVD), plasma-enhanced chemical vapor deposition (PECVD), physical vapor deposition (PVD), atomic layer deposition (ALD), thermal oxidation, or any combination(s) of the above. In an illustrative implementation, first dielectric layer 22 is a metal-oxide compound formed by chemical vapor deposition, physical vapor deposition, or by atomic layer deposition having a typical final thickness is in the range of 0.1-10 nanometers, though other thicknesses may be used. A suitable metal oxide compound for use as first dielectric layer 22 is a hafnium-based dielectric, such as hafnium oxide (preferably $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_X$, $ZrSiO_X$, $ZrHfOx$, $LaSiO_X$, $YSiO_X$, $ScSiO_X$, $CeSiO_X$, $HfLaSiO_X$, $HfAlO_X$, $ZrAlO_X$, and $LaAlO_X$. In addition, multi-metallic oxides (for example barium strontium titanate, BST) may also provide high-k dielectric properties. As will be appreciated, a high-k dielectric material is an insulator material having a dielectric constant value which is a measure of how much charge a material can hold, and will typically have a dielectric constant value above 3.9, the value of silicon dioxide.

After forming the gate dielectric layer 22, a first capping oxide layer 23 is disposed on the gate dielectric layer 22 over the NMOS and PMOS areas 96, 97. The first capping oxide layer 23 will provide a first dopant species for doping the gate dielectric layer 22 in the NMOS device area 96. In selected embodiments, the first capping oxide layer 23 is formed using any desired deposition or sputtering process, such as CVD, PECVD, PVD, ALD, molecular beam deposition (MBD) or any combination(s) thereof. A suitable metal oxide compound for use as the first capping oxide layer 23 is a lanthanum-based dielectric, such as lanthanum oxide (preferably $La_2O_3$) which may be deposited by CVD to a predetermined thickness in the range of 2-4 Angstroms, though other capping oxide layer materials with different thicknesses may be used. For example, a capping oxide layer material may be a metal oxide of group IIA or IIIB elements, such as MgO, SrO, BaO, $Y_2O_3$, and $La_2O_3$, or rare earth oxides formed from the Lanthanide row elements, such as $Gd_2O_3$, $Dy_2O_3$, $Er_2O_3$, etc. As will be appreciated, the capping elements can be deposited as metals as well as metal oxides. In addition, the thickness of the first capping oxide (e.g., $La_2O_3$) is controlled to provide the requisite amount of doping needed to tune the threshold voltage of the finally formed NMOS transistor devices. Thus, the amount of La doping in the high-k film depends on a variety of factors, including the thicknesses of the first capping oxide layer 23 and the gate dielectric layer 22, the materials used to form the first capping oxide layer 23 and the gate dielectric layer 22, and processing details of the thermal anneal step (described below), and the target threshold voltage shift. For example, in an example implementation, the deposited first capping oxide layer 23 formed on top of a $HfO_2$ gate dielectric layer 22 could be a layer of $La_2O_3$ that is 2 Angstroms thick or that contains an equivalent dosage of Lanthanum (e.g., $5.0 \times 10^{14}$ Lanthanum atoms/cm$^2$) based on the density of the $La_2O_3$ and the thickness of the film.

Figure 4:
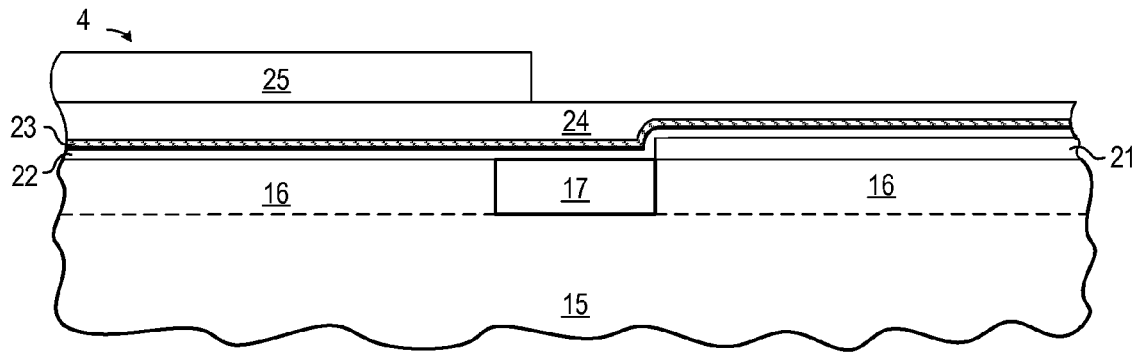
FIG. 4 illustrates processing subsequent to FIG. 3 after a first metal-based layer is deposited over the semiconductor wafer structure and a patterned etch mask is formed on the first metal-based layer in the NMOS areas.

FIG. 4 illustrates processing of a semiconductor wafer structure 4 subsequent to FIG. 3 after a first metal-based layer 24 is deposited over the semiconductor wafer structure and a patterned etch mask 25 is formed on the first metal-based layer 24 in the NMOS areas. In selected embodiments, the first metal-based layer 24 is formed using any desired deposition or sputtering process, such as CVD, PECVD, PVD, ALD, molecular beam deposition (MBD) or any combination(s) thereof. A suitable metal-based material for use as the first metal-based layer 24 is titanium nitride (e.g., TiN) which may be deposited to a predetermined thickness of less than 20-100 Angstroms (e.g., 70 Angstroms), though other metallic layer materials (e.g., selected from the group consisting of Ti, Ta, Ir, Mo, Ru, W, Os, Nb, Ti, V, Ni) with different thicknesses may be used. The first metal-based layer 24 will help protect the underlying dielectric layers 22, 23 from coming into contact with the subsequently formed resist layer 25 in the NMOS device area 96. This protection function may be enhanced by depositing a silicon layer (e.g., amorphous silicon) over the metal-based layer 24 to a predetermined thickness (e.g., 100-200 Angstroms).

As depicted in FIG. 4, a patterned etch mask 25 is subsequently formed on the first metal-based layer 24 in the NMOS areas 96. In particular, a layer of photoresist may be applied and patterned directly on the first metal-based layer 24 (or amorphous silicon protective layer, if present) to mask the NMOS device areas 96, or a multi-layer masking technique may be used to sequentially forming a first anti-reflective coating (ARC) layer, a second masking layer (such as a hardmask or TEOS layer) and a photoresist layer which is patterned and trimmed to form a resist pattern 25 over the first metal-based layer 24 (or amorphous silicon protective layer) in the NMOS device areas 96. The first ARC layer will act as a hard mask when the amorphous silicon protective layer and first metal-based layers 24 are subsequently etched. In turn, the second masking layer will serve as a hard mask for the etching of the first ARC layer, and the photoresist layer may be formed from any appropriate photoresist material (e.g., 193 nm resist) that is patterned (e.g., using a 193 nm develop) and etched to form a resist pattern over the second masking layer. With this scheme, the patterned resist mask 25 is not formed directly on the gate dielectric layer 22, but is instead formed on the first metal-based layer 24 (or amorphous silicon protective layer, if present), which allows the resist to be reworked without damaging the gate dielectric layer.

Figure 5:
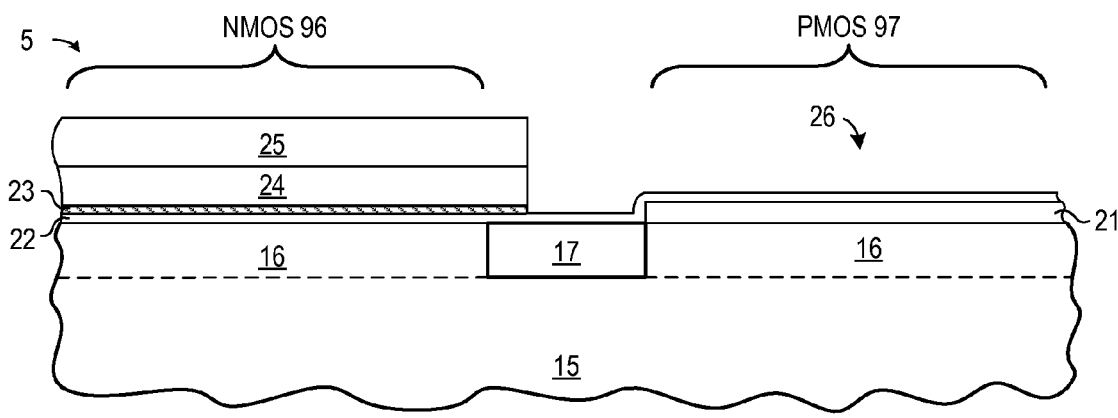
FIG. 5 illustrates processing subsequent to FIG. 4 after the first metal-based layer and first capping oxide layer are selectively removed from the PMOS areas.

The result of the selective etching process is shown in FIG. 5 which illustrates processing of a semiconductor wafer structure 5 subsequent to FIG. 4 after the exposed portions of the first metal-based layer 24 and first capping oxide layer 23 are selectively removed from the PMOS areas 97, thereby exposing the gate dielectric layer 22 in a first region 26. In particular, with the patterned resist or mask layer 25 in place, the exposed portions of the amorphous silicon protective layer (if present), first metal-based layer 24, and first capping oxide layer 23 are selectively etched and removed from the PMOS region 97, thereby leaving portions of the first metal-based layer 24 and first capping oxide layer 23 in the NMOS region 96. The pattern transfer and etching of the mask layer 25 may use one or more etching steps to remove the unprotected portions of the layers 23, 24, including a dry etching process such as reactive-ion etching, ion beam etching, plasma etching or laser etching, a wet etching process wherein a chemical etchant is employed or any combination thereof. For example, the exposed portion of any amorphous silicon protective layer may be anisotropically etched down to the first metal-based layer 24 using a reactive ion etch process. After the mask etch process, the patterned photoresist layer 25 is stripped, such as by using an non-oxidizing ash chemistry or solvent-based wet removal process which does not oxidize the underlying first metal-based TiN layer 24. The unetched portion of the amorphous silicon protective layer may then be used as an etch mask while a metal etch process (e.g., an RCA standard clean 1 solution) is applied to remove the exposed first metal-based (TiN) layer 24 and the first capping oxide ($La_2O_3$) layer 23 from the PMOS regions 97. Finally, a silicon etch process (e.g., $NH_4OH$ wet clean solution at 65 degrees Celsius) may be applied to remove any remaining amorphous silicon protective layer from the NMOS regions 96.

Figure 6:
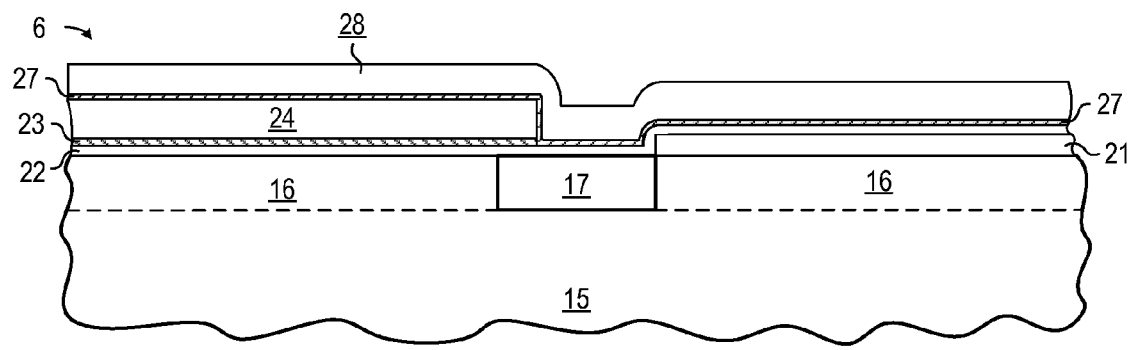
FIG. 6 illustrates processing subsequent to FIG. 5 after a second capping oxide layer and second metal-based layer is are sequentially disposed over the semiconductor wafer structure.

FIG. 6 illustrates processing of a semiconductor wafer structure 6 subsequent to FIG. 5 after the resist masking layer 25 is removed and a second capping oxide layer 27 and second metal-based layer 28 are sequentially disposed over the semiconductor wafer structure. In particular, after exposing the gate dielectric layer 22 in a first region 26, a second capping oxide layer 27 is deposited over the NMOS and PMOS areas 96, 97 of the semiconductor wafer structure 6. The second capping oxide layer 27 will provide a second dopant species for doping the gate dielectric layer 22 in the PMOS device area 97. In selected embodiments, the second capping oxide layer 27 is formed using any desired deposition or sputtering process, such as CVD, PECVD, PVD, ALD, molecular beam deposition (MBD) or any combination(s) thereof. A suitable metal oxide compound for use as the second capping oxide layer 27 is an aluminum-based dielectric, such as aluminum oxide (preferably $Al_2O_3$) which may be deposited by CVD to a predetermined thickness in the range of 2-8 Angstroms, though other capping oxide layer materials with different thicknesses may be used. As will be appreciated, the amount of the second dopant species (e.g., Aluminum) contained in the second capping oxide layer 27 is controlled to provide the requisite amount of doping needed to tune the threshold voltage of the finally formed PMOS transistor devices, and will depend on a variety of factors, including the thicknesses of the second capping oxide layer 27 and the gate dielectric layer 22, the materials used to form the second capping oxide layer 27 and the gate dielectric layer 22, and processing details of the thermal anneal step (described below), and the target threshold voltage shift. For example, in an example implementation, the second capping oxide layer 27 is deposited as a layer of $Al_2O_3$ that is 4 Angstroms thick or that contains an equivalent dosage of Aluminum (e.g., $2.0 \times 10^{15}$ Aluminum atoms/cm$^2$) based on the density of the $Al_2O_3$ and the thickness of the film.

After forming the second capping oxide layer 27 over the semiconductor wafer structure 6, a second metal-based layer 28 is deposited on the second capping oxide layer 27 using any desired deposition or sputtering process, such as CVD, PECVD, PVD, ALD, molecular beam deposition (MBD) or any combination(s) thereof. A suitable metal-based material for use as the second metal-based layer 28 is titanium nitride (e.g., TiN) which may be deposited to a predetermined thickness of less than 20-100 Angstroms, though other metallic layer materials with different thicknesses may be used.

Figure 7:
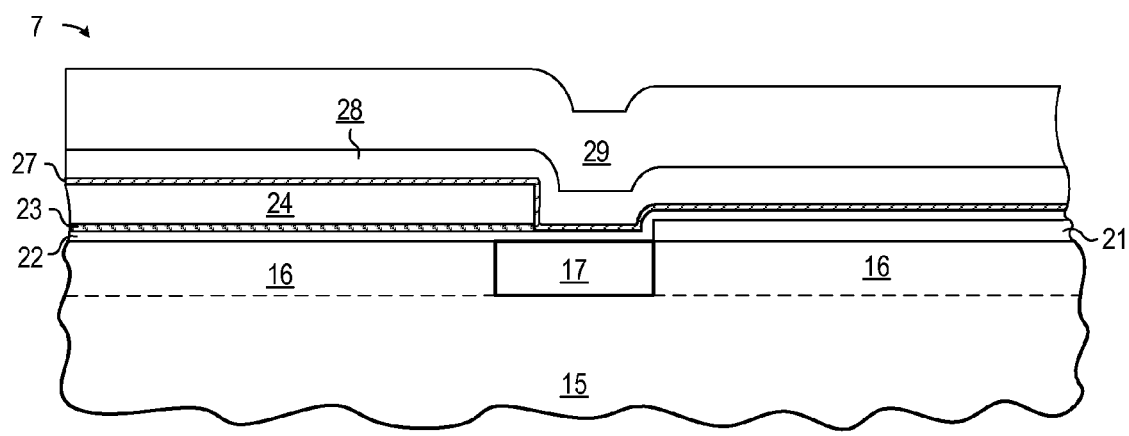
FIG. 7 illustrates processing subsequent to FIG. 6 after a capping layer of amorphous silicon is disposed over the semiconductor wafer structure.

FIG. 7 illustrates processing of a semiconductor wafer structure 7 subsequent to FIG. 6 after a capping layer of amorphous silicon 29 is disposed on the second metal-based layer 28. The amorphous silicon layer 29 may be deposited by CVD to a predetermined thickness in the range of 100-300 Angstroms (e.g., 200 Angstroms), though different thicknesses may be used. As deposited, the amorphous silicon layer 29 covers the NMOS and PMOS device area 96, 97.

Figure 8:
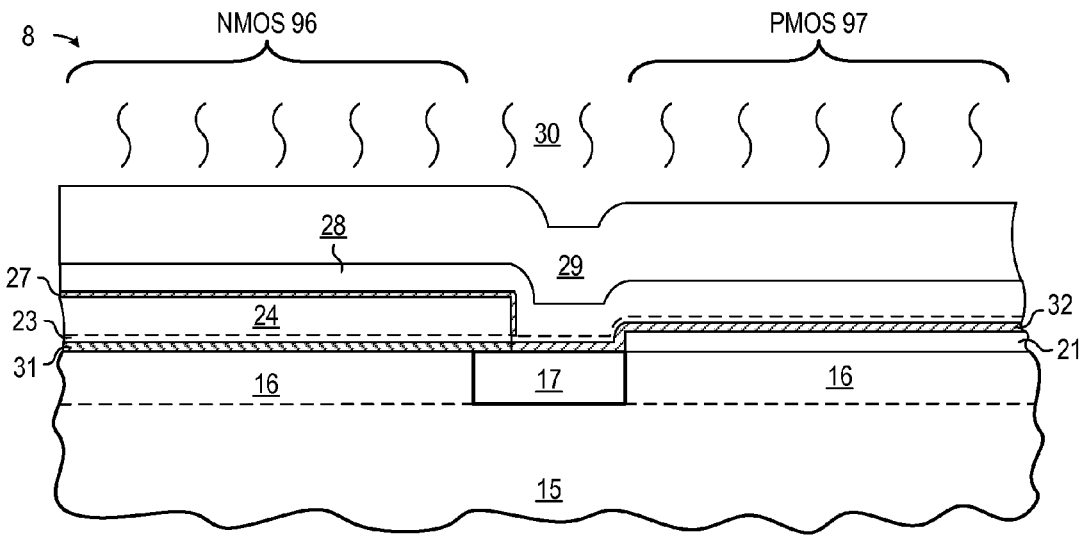
FIG. 8 illustrates processing subsequent to FIG. 7 after a thermal anneal process drives dopants from the first and second capping oxide layers into the high-k gate dielectric layer in the PMOS and NMOS areas, respectively.

After depositing the amorphous silicon capping layer 29, a thermal anneal process may be applied to drive or diffuse the first and second dopant species from the first and second capping oxide layers 23, 27 into the underlying gate dielectric layer 22. During thermal annealing, the amorphous silicon layer 29, first metal-based layer 24, and second metal-based layer 28 assist with the diffusion process by serving as capping layers for the dopant species in the first and second capping oxide layers 23, 27. An example thermal anneal process is shown in FIG. 8 which illustrates processing of a semiconductor wafer structure 8 subsequent to FIG. 7 after a thermal anneal process 30 drives dopants from the first and second capping oxide layers 23, 27 into the high-k gate dielectric layer 22 in the NMOS and PMOS areas 96, 97. While any desired thermal anneal process may be used, in selected example embodiments, a high temperature (e.g., 1000 degrees Celsius) nitrogen anneal process may be used, where the time, temperature and other conditions for the nitrogen anneal process are selected to optimize the diffusion of the first and second dopant species (e.g., La and Al) into the underlying gate dielectric layer 22 (e.g., $HfO_2$). For example, a rapid thermal anneal process may be used which heats the semiconductor device 8 with a temperature ramp up (e.g., 50 degrees per second) to a target temperature of between approximately 800 and 1200 degrees Celsius in a nitrogen atmosphere where the temperature is maintained for 1-60 seconds (e.g., a spike anneal drive process), followed by a rapid temperature ramp down. Of course, other thermal anneal processes may be used to incorporate the first and second dopant species into the underlying gate dielectric layer 22, thereby creating a first doped gate dielectric layer 31 (which is doped with La) over the NMOS areas 96, and a second doped gate dielectric layer 32 (which is doped with Al) over the PMOS areas 97. At the stage shown in FIG. 8, the anneal process 30 creates fixed charges in the first and second doped gate dielectric layers 31, 32 that positively shift the threshold voltage for the PMOS devices and negatively shift the threshold voltage for the NMOS devices, as finally formed. In effect, the thermal anneal process diffuses the first and second capping oxide layers 23, 27 into the underlying high-k gate dielectric $HfO_2$ layer 22, and as a result, there is no separate oxide etch process required for the first and second capping oxide layers 23, 27.

Figure 9:
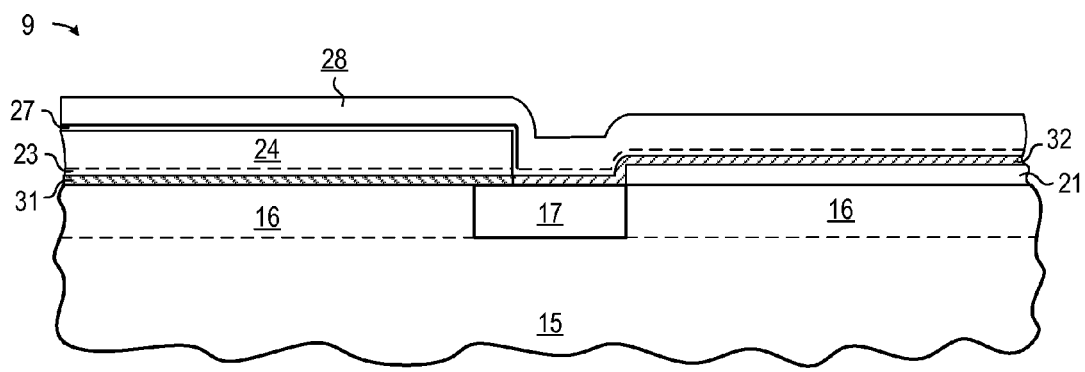
FIG. 9 illustrates processing subsequent to FIG. 8 after the capping layer of amorphous silicon is removed.
Figure 10:
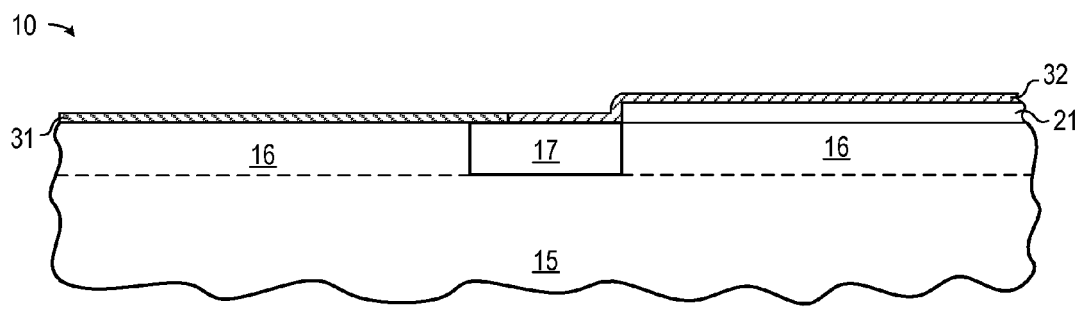
FIG. 10 illustrates processing subsequent to FIG. 9 after the second metal-based layer is removed to expose the high-k gate dielectric layer having different doping in the PMOS and NMOS areas.

Once the dopant species are diffused into the high-k gate dielectric $HfO_2$ layer 22 to form the first and second doped gate dielectric layers 31, 32, the stack is deprocessed to remove the overlying capping layers. First, the amorphous silicon layer 29 is removed, such as shown in FIG. 9 which illustrates processing of a semiconductor wafer structure 9 subsequent to FIG. 8 where the silicon layer 29 has been removed using a conventional etching process, such as by applying a wet etch using an HF pre-clean process and a diluted $NH_4OH$ wet clean solution at 25 degrees Celsius. In other embodiments, silicon layer 29 can be removed using a dry etch process. After clearing the amorphous silicon layer 29, a metal etch process (e.g., an RCA standard clean 1 solution) is applied to remove the remaining second metal-based (TiN) layer 28, as shown in FIG. 10 which illustrates processing of a semiconductor wafer structure 10 subsequent to FIG. 9 after the second metal-based layer 28 is removed to expose the high-k gate dielectric layers 31, 32 having different doping in the PMOS and NMOS areas. With the disclosed embodiments, there is no separate etch process for removing the first and second capping oxide layers ($La_2O_3$ and $Al_2O_3$) since they have already been driven into the gate dielectric ($HfO_2$) layer with the thermal anneal process.

Figure 11:
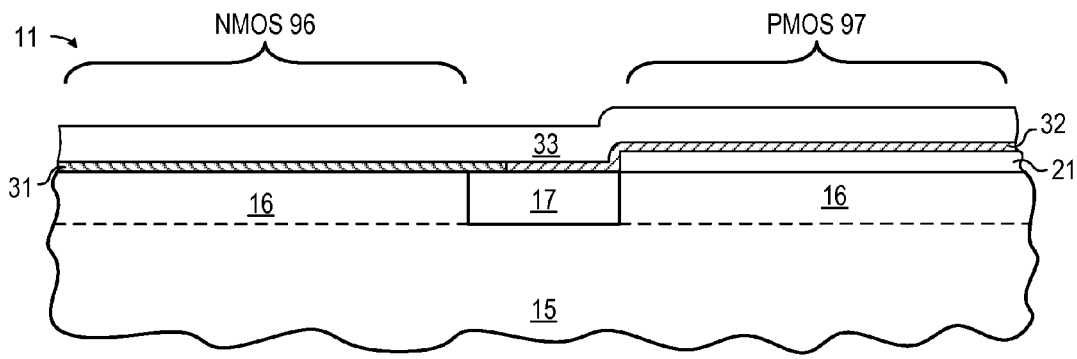
FIG. 11 illustrates processing subsequent to FIG. 10 after a third metal-based layer is formed on the exposed high-k gate dielectric layer.

Having adjusted the doping of the first and second doped gate dielectric layers 31, 32, a single metal gate stack may be formed by sequentially forming a metal-based layer and a polysilicon gate layer. In this context, a single metal gate stack can refer to forming one or more layers of metal-based materials on both the PMOS and NMOS areas, though a first metal-based layer can be formed on the PMOS area and a second metal-based layer can be formed on the NMOS area which can result in NMOS and PMOS gate stacks having unbalanced heights. FIG. 11 illustrates processing of a semiconductor wafer structure 11 subsequent to FIG. 10 after a third metal-based layer 33 is formed on the exposed high-k gate dielectric layer 31, 32. In selected embodiments, the third metal-based layer 33 is deposited on the doped gate dielectric layers 31, 32 using any desired deposition or sputtering process, such as CVD, PECVD, PVD, ALD, molecular beam deposition (MBD) or any combination(s) thereof. A suitable metal-based material for use as the second metal-based layer 33 is titanium nitride (e.g., TiN) which may be deposited over the NMOS and PMOS regions to a predetermined thickness of less than 10-100 Angstroms, though other metallic layer materials with different thicknesses may be used. In selected embodiments, the third metal-based layer 33 may include an element selected from the group consisting of Ti, Ta, Hf, Zr, Ir, Mo, Ru, W, Os, Nb, Ti, V, Ni, and Re. In particular, the third metal-based layer 33 is formed with a metal or metal-based layer (such as TiN, TaC, HfC, TaSi, ZrC, Hf, etc.) or even a conductive metal oxide (such as $IrO_2$). At this point, it will be appreciated that the dual-capping oxide approach described herein allows the same metal layer(s) to be formed on both the nFET and pFET regions, resulting in balanced NMOS and PMOS gate stack heights and simplification of the subsequent gate etch process compared to dual-metal gate integrations where two different gate heights must be simultaneously etched. In contrast, selected embodiments of the present invention remove the sacrificial metal layers after annealing in the dopant species, and then deposit another gate metal so that there is only one metal layer to be etched for both the NMOS and PMOS gates.

Figure 12:
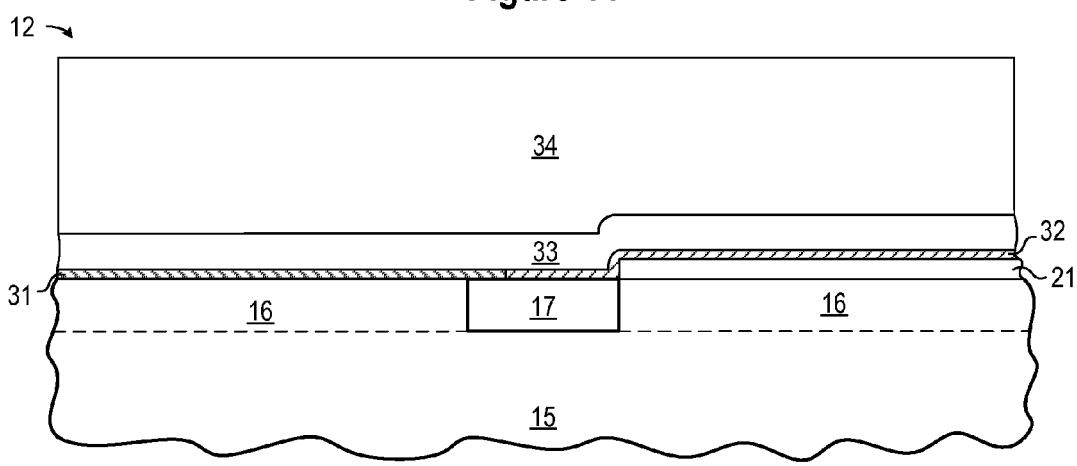
FIG. 12 illustrates processing subsequent to FIG. 11 after a gate layer of amorphous silicon is disposed over the third metal-based layer.

Turning now to FIG. 12, there is illustrated the processing of a semiconductor wafer structure 12 subsequent to FIG. 11 after a semiconductor gate layer 34 is disposed over the third metal-based layer 33. In selected embodiments, the semiconductor gate layer 34 is a silicon-containing layer, such as a polysilicon cap layer or a polysilicon-germanium cap layer that is formed using CVD, PECVD, PVD, ALD, or any combination(s) thereof to form a layer of amorphous silicon 34 to a predetermined thickness in the range of 400-1000 Angstroms (e.g., 600 Angstroms), though other materials and thicknesses may be used. Silicon-containing layer 34 may also be a doped or undoped amorphous silicon or silicon-germanium layer. An anti-reflective coating (ARC) (not shown) may subsequently be formed over silicon-containing gate layer 34 to a thickness in the range of approximately 1-20 nm, though other thicknesses may be used. In a selected embodiment, ARC layer is formed by depositing a silicon-rich silicon nitride layer, an organic ARC, a silicon-oxy nitride, or any ARC material which serves an ARC function for the particular lithography process. As will be appreciated, ARC layer may be applied directly to the silicon-containing layer 34 or as part of a multilayer mask on the silicon-containing layer 34. As deposited, the amorphous silicon layer 34 covers the NMOS and PMOS device area 96, 97. The deposited silicon-containing layer 34 forms a gate stack that has the same metal layer 33 on both the NMOS and PMOS device areas 96, 97 and that has substantially the same stack height in the NMOS and PMOS device areas 96, 97.

Figure 13:
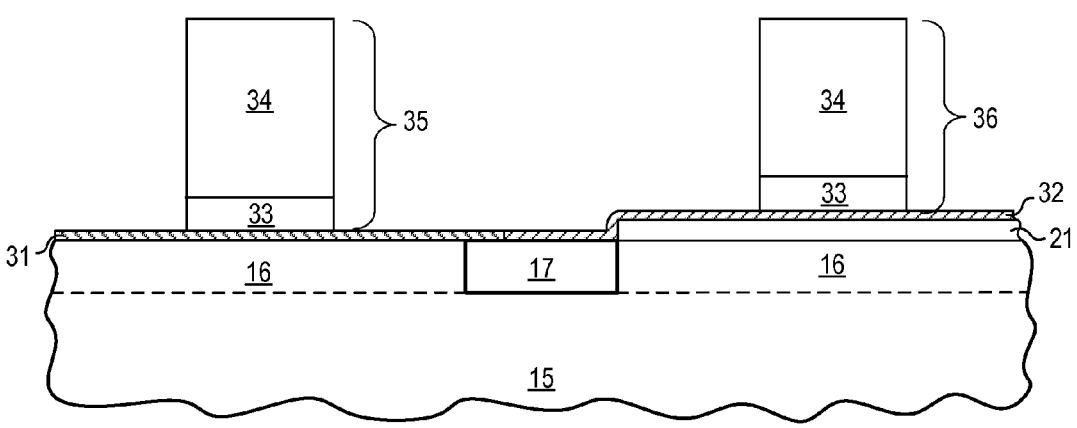
FIG. 13 illustrates processing subsequent to FIG. 12 after the single metal gate stack is selectively etched to form NMOS and PMOS gate electrodes.

Once the unetched single metal gate stack is formed, an etched gate stack may be formed using any desired pattern and etching processes to form an etched gate stack, including application and patterning of photoresist directly on the ARC layer, though multi-layer masking techniques may also be used. Regardless of which etching process is used, FIG. 13 illustrates processing of a semiconductor wafer structure 13 subsequent to FIG. 12 after the single metal gate stack is selectively etched to form NMOS gate electrodes 35 and PMOS gate electrodes 36. As a preliminary step, a gate mask and etch process is performed to pattern the silicon-containing cap layer 34 and underlying metal-based layer 33, resulting in the formation of an etched gate stacks 35, 36 over the substrate 11. The etched NMOS gate stack 35 includes a single metal layer 34 on the lanthanum-doped high-k gate dielectric layer 31 and an overlying silicon-containing cap layer 34, and as a result of the gate dielectric doping, has a negatively shifted threshold voltage and a reduced effective work function. Likewise, the etched PMOS gate stack 36 includes a single metal layer 34 on the aluminum-doped high-k gate dielectric layer 32 and an overlying silicon-containing cap layer 34, and as a result of the gate dielectric doping, has a positively shifted threshold voltage and an increased effective work function. The ARC layer may also be initially patterned during the gate stack etch, but it can be fully removed after the gate etch, and thus is not shown in FIG. 13. Because silicon-containing layer 34 serves to protect the metal gate layer 33 during subsequent etches and cleans, there is no need to keep an ARC layer on top of the gates. This is advantageous in that the ARC layer need not later be separately etched during a contact etch process to form a contact to the gate, and instead can be wet etched. Furthermore, complete removal of the ARC layer enables a more robust silicidation process on top of the gate.

As will be appreciated, additional processing steps may be used to complete the fabrication of the semiconductor devices 35, 36 into a functioning device. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact plugs and multiple levels of interconnect(s) that are used to connect the device components in a desired manner to achieve the desired functionality. Once the wafer fabrication process is completed, the wafer can be singulated or diced into separate integrated circuits dies for subsequent electrical connection, such as by leadframe attachment, wirebonding and encapsulation. Thus, the specific sequence of steps used to complete the fabrication of the device components may vary, depending on the process and/or design requirements.

By now it should be appreciated that there has been provided a method for forming a semiconductor structure. In the disclosed methodology, a first semiconductor layer is provided that includes PMOS and NMOS device areas, and a high-k gate dielectric layer is formed over the first semiconductor layer in the PMOS and NMOS device areas, such as by depositing hafnium oxide. In the NMOS device area, a first capping oxide layer (e.g., Lanthanum oxide) is formed or deposited on the high-k gate dielectric layer which includes a first dopant species (e.g., La) for doping the high-k gate dielectric layer in the NMOS device area. In selected embodiments, the first capping oxide layer is formed by sequentially depositing a Lanthanum oxide layer, a first metal-based layer (e.g., TiN), and an optional amorphous silicon layer over the high-k gate dielectric layer in the PMOS and NMOS device areas, forming a patterned resist layer as an etch mask over the first metal-based layer to cover the NMOS device area, and then selectively etching the first metal-based layer and the Lanthanum oxide layer in the PMOS device area using the patterned resist layer to expose the high-k gate dielectric layer in the PMOS device area. After the selectively etch step(s), the patterned resist layer may be stripped from the first metal-based layer by performing an non-oxidizing ash chemistry or solvent-based wet removal to remove the patterned resist layer from the NMOS device area without oxidizing the portion of the first metal-based layer in the NMOS device area, thereby exposing a portion of the first metal-based layer in the NMOS device area. After forming the first capping oxide layer, a second capping oxide layer (e.g., Aluminum oxide) is formed on the high-k gate dielectric layer in at least the PMOS device area which includes a second dopant species (e.g., Al) for doping the high-k gate dielectric layer in the PMOS device area. In selected embodiments, the second capping oxide layer is formed by sequentially depositing an Aluminum oxide layer, a second metal-based layer (e.g., TiN), and a layer of amorphous silicon over the exposed high-k gate dielectric layer in the PMOS device and over the portion of the first metal-based layer in the NMOS device area. The first and second dopant species are then diffused into the high-k gate dielectric layer in the PMOS and NMOS device areas to form a first fixed charge in the PMOS device area of the high-k gate dielectric area and a second fixed charge in the NMOS device area of the high-k gate dielectric area. The diffusion may be implemented by thermally annealing the first and second capping oxide layers to diffuse the first and second dopant species into the high-k gate dielectric layer in the PMOS and NMOS device areas. In other embodiments, the first and second dopant species may be diffused by forming a capping layer of amorphous silicon to cover the first capping oxide layer in the NMOS device area and to cover the second capping oxide layer in the PMOS device area, and then thermally annealing the first and second capping oxide layers in a nitrogen-based environment to diffuse the first and second dopant species into the high-k gate dielectric layer in the PMOS and NMOS device areas. Subsequently, a gate stack is formed by depositing a metal-based gate layer over the high-k gate dielectric layer in the PMOS and NMOS device areas, and then depositing a silicon-containing gate layer on the first metal-based gate layer in the PMOS and NMOS device areas. The silicon-containing gate layer and the metal-based gate layer are selectively etched to form NMOS and PMOS gate electrodes in the NMOS and PMOS device areas.

In another form, there is provided a method of forming PMOS and NMOS gate electrode structures on a substrate structure. As disclosed, first and second capping oxide layers are selectively formed on a gate dielectric layer along with one or more sacrificial metal layers formed over the first and second capping oxide layers. In selected embodiments, the first and second capping oxide layers are formed by selectively forming a first capping oxide layer of Lanthanum oxide and a first sacrificial metal layer on the gate dielectric layer in the NMOS device area, followed by selectively forming a second capping oxide layer of Aluminum oxide and a second sacrificial metal layer on the gate dielectric layer in the PMOS device area. Alternatively, the sequence can be reversed so that a first capping oxide layer is formed on at least the PMOS device area, followed by forming a second capping oxide layer on at least the NMOS device area. In other embodiments, the first and second capping oxide layers are formed by depositing a first capping oxide layer on the gate dielectric layer in at least the NMOS device area; depositing a first sacrificial metal layer over the first capping oxide layer; depositing a capping layer of amorphous silicon on the first sacrificial metal layer; selectively removing the first sacrificial metal layer and first capping oxide layer from the PMOS device area; forming a second capping oxide layer on the gate dielectric layer in at least the PMOS device area; forming a second sacrificial metal layer over the second capping oxide layer in at least the PMOS device area; and depositing a capping layer of amorphous silicon on the second sacrificial metal layer. As formed, the first capping oxide layer includes a first dopant species and is formed over an NMOS device area, such as by depositing a metal or rare earth oxide comprising La, Mg, Sr, Ba, Y, Gd, Dy or Er. As for the second capping oxide layer, it includes a second dopant species and is formed over a PMOS device area, such as by depositing a metal oxide comprising Al. The first and second capping oxide layers are annealed to diffuse the first and second dopant species into the gate dielectric layer in the NMOS and PMOS device areas, respectively, thereby forming a separately doped gate dielectric layer comprising a first fixed charge region in the NMOS device area of the gate dielectric area and a second fixed charge region in the PMOS device area of the gate dielectric area. The anneal process diffuses the first dopant species into a high-k dielectric layer to provide a negatively-shifted threshold voltage for the finally formed NMOS gate electrode structures, and diffuses the second dopant species into the high-k dielectric layer to provide a negatively-shifted threshold voltage for the finally formed NMOS gate electrode structures. After the anneal process, the separately doped gate dielectric layer is exposed by removing at least the one or more sacrificial metal layers, followed by the deposition of a single metallic gate layer (e.g., a metal-based layer comprising Ti, Ta, Hf, Zr, Ir, Mo, Ru, W, Os, Nb, Ti, V, Ni, Re or Hf) on the separately doped gate dielectric layer in the NMOS and PMOS device areas, and then the deposition of a silicon-containing gate layer on the single metallic gate layer in the NMOS and PMOS device areas. By selectively etching the silicon-containing gate layer and the single metallic gate layer, one or more PMOS gate electrode structures are formed over the PMOS device area and one or more NMOS gate electrode structures are formed over the NMOS device area.

In yet another form, there is provided a method of forming PMOS and NMOS gate electrode structures on a semiconductor substrate structure. As disclosed, a high-k gate dielectric layer is formed over the semiconductor substrate structure in the PMOS and NMOS device areas. A layer of lanthanum oxide is deposited on the high-k gate dielectric layer, followed by the deposition of a first sacrificial metal layer over the layer of lanthanum oxide. After selectively removing the first sacrificial metal layer and the layer of lanthanum oxide to expose the high-k gate dielectric layer in the PMOS device area, a layer of aluminum oxide is deposited on the exposed high-k gate dielectric in the PMOS device area and on the first sacrificial metal layer in the NMOS device area. On the layer of aluminum oxide, a second sacrificial metal layer is deposited, followed by the deposition of an amorphous silicon layer on the second sacrificial metal layer. An anneal process is then applied to diffuse lanthanum from the layer of lanthanum oxide into the high-k gate dielectric layer in the NMOS device area, and to diffuse aluminum from the layer of aluminum oxide into the high-k gate dielectric layer in the PMOS device area. The high-k gate dielectric layer is then exposed by removing at least the layer of amorphous silicon and the first and second sacrificial metal layers. On the high-k gate dielectric layer, a metal gate electrode stack which includes one or more metal-based layers is formed in the PMOS and NMOS device areas. The metal gate electrode stack is selectively etched to form NMOS and PMOS gate electrodes in the NMOS and PMOS device areas. With this fabrication sequence, the anneal process increases a first work function characteristic of the first metallic layer formed over the PMOS device area and decreases a second work function characteristic of the first metallic layer formed over the NMOS device area by virtue of the diffusion of the lanthanum and aluminum into the high-k gate dielectric layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. For example, selected embodiments of the present invention may reverse the fabrication sequence to first selectively form the aluminum oxide capping layer over the PMOS area, followed by forming the lanthanum oxide capping layer over the NMOS area. Thus, the particular embodiments disclosed above are illustrative only and should not be taken as limitations upon the present invention, as the invention may be modified and practiced in different but equivalent manners apparent to those skilled in the art having the benefit of the teachings herein. For example, the methodology of the present invention may be applied using materials other than expressly set forth herein. In addition, the invention is not limited to any particular type of integrated circuit described herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor structure, comprising:

provA method for forming a semiconductor structure, comprising:

providing a first semiconductor layer comprising a PMOS device area and an NMOS device area;

forming a high-k gate dielectric layer over the first semiconductor layer in the PMOS and NMOS device areas;

forming a first capping oxide layer on the high-k gate dielectric layer in at least the NMOS device area, where the first capping oxide layer comprises a first dopant species for doping the high-k gate dielectric layer in the NMOS device area;

forming a second capping oxide layer on the high-k gate dielectric layer in at least the PMOS device area, where the second capping oxide layer comprises a second dopant species for doping the high-k gate dielectric layer in the PMOS device area;

diffusing the first and second dopant species into the high-k gate dielectric layer in the PMOS and NMOS device areas, respectively, thereby forming a first fixed charge region in the PMOS device area of the high-k gate dielectric area and a second fixed charge region in the NMOS device area of the high-k gate dielectric area;

forming a metal-based gate layer over the high-k gate dielectric layer in the PMOS and NMOS device areas;

depositing a semiconductor gate layer over the first metal-based gate layer in the PMOS and NMOS device areas; and selectively etching the semiconductor gate layer and the metal-based gate layer to form NMOS and PMOS gate electrodes for NMOS and PMOS devices in the NMOS and PMOS device areas.

2. The method of claim 1 where forming the high-k gate dielectric layer comprises depositing hafnium oxide on the first semiconductor layer.

3. The method of claim 1 where forming the first capping oxide layer comprises depositing Lanthanum oxide on the high-k gate dielectric layer.

4. The method of claim 1 where forming the first capping oxide layer comprises:
   depositing a layer of Lanthanum oxide on the high-k gate dielectric layer in the PMOS and NMOS device areas;
   depositing a first metal-based layer on the layer of Lanthanum oxide;
   forming a patterned resist layer as an etch mask over the first metal-based layer to cover the NMOS device area; and
   selectively etching the first metal-based layer and the layer of Lanthanum oxide in the PMOS device area using the patterned resist layer to expose the high-k gate dielectric layer in the PMOS device area.

5. The method of claim 4, further comprising depositing a first layer of amorphous silicon on the first metal-based layer in the PMOS and NMOS device areas before forming the patterned resist layer.

6. The method of claim 4, further comprising stripping the patterned resist layer from the first metal-based layer after selectively etching the first metal-based layer, the layer of Lanthanum oxide and the first capping oxide layer, thereby exposing a portion of the first metal-based layer in the NMOS device area.

7. The method of claim 6, where stripping the patterned resist layer comprises performing a non-oxidizing ash chemistry or solvent-based wet removal process to remove the patterned resist layer from the NMOS device area without oxidizing the portion of the first metal-based layer in the NMOS device area.

8. The method of claim 6, where forming the second capping oxide layer comprises:
   depositing a layer of Aluminum oxide on the exposed high-k gate dielectric layer in the PMOS device and on the portion of the first metal-based layer in the NMOS device area;
   depositing a second metal-based layer on the layer of Aluminum oxide in the PMOS and NMOS device areas; and
   depositing a layer of amorphous silicon on the second metal-based layer in the PMOS and NMOS device areas.

9. The method of claim 1, where diffusing the first and second dopant species comprises thermally annealing the first and second capping oxide layers to diffuse the first and second dopant species into the high-k gate dielectric layer in the PMOS and NMOS device areas.

10. The method of claim 1, where diffusing the first and second dopant species comprises:
    forming a capping layer of amorphous silicon to cover the first capping oxide layer in the NMOS device area and to cover the second capping oxide layer in the PMOS device area; and
    thermally annealing the first and second capping oxide layers in a nitrogen-based environment to diffuse the first and second dopant species into the high-k gate dielectric layer in the PMOS and NMOS device areas.

11. The method of claim 1, where forming the first capping oxide layer comprises depositing Lanthanum oxide on the high-k gate dielectric layer in at least the NMOS device area, and where forming the second capping oxide layer comprises depositing aluminum oxide on the high-k gate dielectric layer in at least the PMOS device area.

12. A method of forming PMOS and NMOS gate electrode structures, comprising:
    selectively forming first and second capping oxide layers on a single gate dielectric layer formed over PMOS and NMOS device areas of a substrate along with one or more sacrificial layers formed over the first and second capping oxide layers, where the first capping oxide layer comprises a first dopant species and is formed over a NMOS device area, and where the second capping oxide layer comprises a second dopant species and is formed over an PMOS device area;
    annealing the first and second capping oxide layers to diffuse the first and second dopant species into the gate dielectric layer in the NMOS and PMOS device areas, respectively, thereby forming a separately doped gate dielectric layer comprising a first fixed charge region in the NMOS device area of the gate dielectric area and a second fixed charge region in the PMOS device area of the gate dielectric area;
    exposing the separately doped gate dielectric layer by removing at least the one or more sacrificial layers;
    depositing one or more metal-based gate layers on both of the separately doped gate dielectric layers in the PMOS and NMOS device areas;
    depositing a semiconductor gate layer over the one or more metal-based gate layers in the NMOS and PMOS device areas; and
    selectively etching at least the semiconductor gate layer and the one or more metal-based gate layers to form one or more PMOS gate electrode structures for PMOS devices over the PMOS device area and one or more NMOS gate electrode structures for NMOS devices over the NMOS device area.

13. The method of claim 12, where selectively forming first and second capping oxide layers comprises:
    selectively forming a first capping oxide layer of Lanthanum oxide and a first sacrificial layer on the gate dielectric layer in the NMOS device area; and
    selectively forming a second capping oxide layer of Aluminum oxide and a second sacrificial layer on the gate dielectric layer in the PMOS device area.

14. The method of claim 12, where selectively forming first and second capping oxide layers comprises:
    forming a first capping oxide layer on the gate dielectric layer in at least the NMOS device area;
    forming a first sacrificial layer over the first capping oxide layer in at least the NMOS device area;
    selectively removing the first sacrificial layer and first capping oxide layer from the PMOS device area;
    forming a second capping oxide layer on the gate dielectric layer in at least the PMOS device area; and
    forming a second sacrificial layer over the second capping oxide layer in at least the PMOS device area.

15. The method of claim 14, further comprising depositing a capping layer of amorphous silicon on the first sacrificial layer prior to selectively removing the first sacrificial layer and first capping oxide layer.

16. The method of claim 14, further comprising depositing a capping layer of amorphous silicon on the second sacrificial layer prior to annealing the first and second capping oxide layers.

17. The method of claim 12, where selectively forming first and second capping oxide layers comprises:

forming a first capping oxide layer on the gate dielectric layer in at least the PMOS device area;
forming a first sacrificial layer over the first capping oxide layer in at least the PMOS device area;
selectively removing the first sacrificial layer and first capping oxide layer from the NMOS device area;
forming a second capping oxide layer on the gate dielectric layer in at least the NMOS device area; and
forming a second sacrificial layer over the second capping oxide layer in at least the NMOS device area.

18. The method of claim 12, where selectively forming first and second capping oxide layers comprises depositing a first capping oxide layer on the gate dielectric layer in at least the NMOS device area, where the first capping oxide layer comprises a metal or rare earth oxide comprising La, Mg, Sr, Ba, Y, Gd, Dy or Er.

19. The method of claim 12, where selectively forming first and second capping oxide layers comprises depositing a second capping oxide layer on the gate dielectric layer in at least the PMOS device area, where the second capping oxide layer comprises a metal oxide comprising Al.

20. The method of claim 12, where annealing the first and second capping oxide layers comprises diffusing the first dopant species into a high-k dielectric layer to provide a negatively-shifted threshold voltage for the finally formed NMOS gate electrode structures, and diffusing the second dopant species into the high-k dielectric layer to provide a negatively-shifted threshold voltage for the finally formed NMOS gate electrode structures.

21. The method of claim 12, where depositing the one or more metal-based gate layers comprises depositing a metal-based layer comprising Ti, Ta, Hf, Zr, Ir, Mo, Ru, W, Os, Nb, Ti, V, Ni, Re or Hf.

22. A method of forming PMOS and NMOS gate electrode structures on a semiconductor substrate structure, comprising:
providing a semiconductor substrate structure comprising a PMOS device area and an NMOS device area;
forming a high-k gate dielectric layer over the semiconductor substrate structure in the PMOS and NMOS device areas;
depositing a layer of lanthanum oxide on the high-k gate dielectric layer;
depositing a first sacrificial layer over the layer of lanthanum oxide;
selectively removing the first sacrificial layer and the layer of lanthanum oxide to expose the high-k gate dielectric layer in the PMOS device area, thereby leaving the first sacrificial layer and the layer of lanthanum oxide in the NMOS device area;
depositing a layer of aluminum oxide on the high-k gate dielectric in the PMOS device area and on the first sacrificial layer in the NMOS device area;
depositing a second sacrificial layer over the layer of aluminum oxide;
depositing a layer of amorphous silicon on the second sacrificial layer;
applying an anneal process to diffuse lanthanum from the layer of lanthanum oxide into the high-k gate dielectric layer in the NMOS device area and to diffuse aluminum from the layer of aluminum oxide into the high-k gate dielectric layer in the PMOS device area;
removing at least the layer of amorphous silicon and the first and second sacrificial layers to expose the high-k gate dielectric layer after the applying the anneal process;
forming a metal gate electrode stack comprising a first metallic layer on the high-k gate dielectric layer in the PMOS and NMOS device areas after exposing the high-k gate dielectric layer; and
selectively etching the single metal gate electrode stack to form NMOS and PMOS gate electrodes in the NMOS and PMOS device areas.

* * * * *